(12) United States Patent
Knop et al.

(10) Patent No.: US 8,945,362 B2
(45) Date of Patent: *Feb. 3, 2015

(54) PLATING METHOD

(75) Inventors: Jacek M. Knop, Owego, NY (US); John G. Carter, Ithaca, NY (US); Donald E. Cleary, Littleton, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 1097 days.

This patent is subject to a terminal disclaimer.

(21) Appl. No.: 12/319,753

(22) Filed: Jan. 12, 2009

(65) Prior Publication Data
US 2009/0188804 A1   Jul. 30, 2009

Related U.S. Application Data

(63) Continuation of application No. 11/114,440, filed on Apr. 26, 2005, now Pat. No. 7,582,199.

(60) Provisional application No. 60/565,415, filed on Apr. 26, 2004.

(51) Int. Cl.
*C25D 21/18* (2006.01)
*C25D 5/18* (2006.01)
*H05K 3/42* (2006.01)

(52) U.S. Cl.
CPC  *C25D 5/18* (2013.01); *H05K 3/423* (2013.01); *H05K 3/429* (2013.01); *H05K 2203/1476* (2013.01)
USPC ............... 205/104; 205/102; 205/105

(58) Field of Classification Search
USPC .......................... 205/102, 104, 105
See application file for complete search history.

(56) References Cited

U.S. PATENT DOCUMENTS

| | | | | |
|---|---|---|---|---|
| 2,471,918 | A | * | 5/1949 | Willson et al. ............ 205/293 |
| 2,862,861 | A | * | 12/1958 | Moy ....................... 205/293 |
| 3,945,894 | A | | 3/1976 | Martin et al. |
| 4,152,467 | A | | 5/1979 | Alpaugh et al. |
| 4,189,324 | A | | 2/1980 | Gulla et al. |
| 4,515,829 | A | | 5/1985 | Deckert et al. |
| 4,518,465 | A | * | 5/1985 | Morimoto et al. .......... 427/97.2 |
| 4,683,036 | A | | 7/1987 | Morrissey et al. |
| 4,895,739 | A | | 1/1990 | Bladon |
| 4,897,165 | A | | 1/1990 | Bernards et al. |

(Continued)

FOREIGN PATENT DOCUMENTS

| | | |
|---|---|---|
| EP | 1117283 | 7/2001 |
| GB | 710375 | 6/1954 |

(Continued)

OTHER PUBLICATIONS

Lowenheim (Electroplating, McGraw-Hill Book Co., New York, 1978, pp. 12-13).*

(Continued)

*Primary Examiner* — Luan Van
*Assistant Examiner* — Louis Rufo
(74) *Attorney, Agent, or Firm* — John J. Piskorski

(57) ABSTRACT

Methods for depositing a metal or metal alloy on a substrate and articles made with the methods are described. The metal or metal alloy is deposited on the substrate electrolytically. The current is periodically interrupted during deposition to improve throwing power and reduce nodule formation on the metal or metal alloy deposit.

3 Claims, 3 Drawing Sheets

(56) References Cited

U.S. PATENT DOCUMENTS

| | | | |
|---|---|---|---|
| 4,898,647 A | 2/1990 | Luce et al. | |
| 4,902,610 A | 2/1990 | Shipley | |
| 4,932,518 A | 6/1990 | Bernards et al. | |
| 4,952,286 A | 8/1990 | Bladon et al. | |
| 5,007,990 A | 4/1991 | Bladon | |
| 5,051,154 A | 9/1991 | Bernards et al. | |
| 5,246,817 A | 9/1993 | Shipley | |
| 5,252,196 A | 10/1993 | Sonnenberg et al. | |
| 5,326,454 A | 7/1994 | Engelhaupt | |
| 5,834,140 A | 11/1998 | Wolski et al. | |
| 5,849,171 A | 12/1998 | Dahms et al. | |
| 5,958,207 A | 9/1999 | Mull | |
| 5,972,192 A * | 10/1999 | Dubin et al. | 205/101 |
| 6,099,711 A * | 8/2000 | Dahms et al. | 205/101 |
| 6,129,830 A | 10/2000 | Senge et al. | |
| 6,402,924 B1 | 6/2002 | Martin et al. | |
| 6,426,011 B1 | 7/2002 | Katoh | |
| 6,527,802 B1 | 3/2003 | Mayer et al. | |
| 6,565,731 B1 | 5/2003 | Couble et al. | |
| 7,582,199 B2 * | 9/2009 | Knop et al. | 205/104 |
| 2003/0070934 A1 | 4/2003 | Cobley et al. | |
| 2004/0011432 A1 * | 1/2004 | Podlaha et al. | 148/336 |
| 2004/0154925 A1 * | 8/2004 | Podlaha et al. | 205/104 |
| 2005/0016858 A1 | 1/2005 | Barstad et al. | |

FOREIGN PATENT DOCUMENTS

| | | |
|---|---|---|
| GB | 932822 | 7/1963 |
| JP | 62127493 | 6/1987 |
| JP | 4280993 | 10/1992 |
| JP | 3098022 B2 | 10/2000 |
| WO | WO 89/07162 | 8/1989 |

OTHER PUBLICATIONS

Kalantary et al., "Pulse Plating of Copper for Printed Circuit Board Technology", Metal Finishing (1991), 89(4), pp. 21-27.

\* cited by examiner

PLATING METHOD

BACKGROUND OF THE INVENTION

The present invention is directed to an improved plating method. More specifically, the present invention is directed to an improved plating method where adjustments of the plating cycle improve throwing power and reduce nodule formation.

Generally, plating substrates with metals includes passing a current between two electrodes in an electrolyte where one of the electrodes is the substrate to be plated. Electrolytes for depositing a metal on a substrate typically include one or more metal ions, a soluble salt in a sufficient amount to impart conductivity to the electrolyte, and additives to improve plating uniformity and quality of the metal deposit. Such additives may include brighteners, levelers, suppressors, antioxidants, and surfactants.

In many conventional plating processes electrodes (cathode and anode) of an external circuit are immersed into the electrolyte and a DC (direct current) is applied across the electrodes. This causes an electrochemical reaction or reduction resulting in deposition of a metal or metal alloy onto a cathode from metal ions in the electrolyte. Current density profile and primary distribution across the cathode varies according to the geometric path or distance between the anode and the cathode leading to deposit thickness variation according to shape and location of the cathode relative to the anode. This effect is most apparent when high applied average current densities are used. Therefore, in order to obtain the best uniformity of metal distribution, low applied average current densities are used.

Alternatively, by using PPR (pulse periodic reverse electroplating) current instead of DC current, uniform metal deposits may be produced at higher current densities. This technique is especially useful for electrolytic copper plating on high aspect printed wiring boards, which are relatively thick boards with small through-hole diameters. Such substrates present plating problems because of their surface geometry, which affects current distribution, and results in measurable differences in current density between the surfaces of the board and the through-holes. The current density difference causes uneven metal deposition with thicker coatings produced on surfaces with higher current densities. Generally, board edges and isolated surface circuitry experience higher current density and result in thicker deposits compared to the center surfaces of the board or the inner surface of the through-holes (sometimes referred to as dog-boning). Additional thickness in these areas may present problems in subsequent processing and assembly operations. A non-uniform surface profile may lead to increased soldermask being required to meet minimum thickness requirements for suitable coverage. A lack of circuit planarity and excess thickness at through-hole entries may interfere with proper location of components during assembly, while methods used to reduce this excess thickness may lead to protracted processing times and a loss of production.

PPR current may produce metal deposits with an even thickness on both the board surface and in the through-holes. A PPR current is created by alternating current modulation between forward and reverse cycles. This is accomplished by inverting the current from cathodic to anodic mode, which disrupts the otherwise constant direct current polarization effects. The degree of disruption occurs according to the primary current distribution with more in the high current density areas than in the low current density areas, thus providing a normalization of deposition rates across complex geometries at higher applied average current densities. Moreover, by maintaining thickness uniformity at higher applied average current densities, the overall metal deposition rate is increased and processing times reduced yielding higher production output.

Although the use of PPR may result in uniform deposit thickness at high current densities, the surface appearance of the resulting deposit may range from a matte to a semi-bright finish relative to the through-hole wall, thus producing a non-uniform deposit appearance between high (surface) and low (through-hole) current densities. On the other hand, if DC current is applied, uniformly bright deposits are typically produced throughout the current density range, but low current densities are used in order to preserve metal deposit thickness uniformity. Accordingly, neither method provides optimum thickness distribution with uniform metal deposit appearance at high current densities.

Metals that may be plated include, for example, copper, copper alloys, nickel, tin, lead, gold, silver, platinum, palladium, cobalt, chromium, and zinc. Electrolytes for metal plating are used for many industrial applications. For example, they may be used in the automotive industry as base layers for subsequently applied decorative and corrosion protective coatings. They also may be used in the electronics industry, such as in the fabrication of printed circuit or wiring boards, and for semiconductor devices. For circuit fabrication in a printed circuit board, a metal such as copper is plated over selected portions of the surface of a printed circuit board and onto the walls of through-holes passing between the surfaces of the circuit board base material. The walls of the through-holes are metallized to provide conductivity between circuit layers on each surface of the board.

U.S. Pat. No. 6,402,924 discloses a method for depositing a metal onto a substrate which has apertures or uneven surfaces. The method improves the surface appearance including brightness, grain structure and through-hole leveling of the deposit while maintaining throwing power at high current densities. Optimum throwing power is achieved when the plating current density at the center of the through-hole is the same as that flowing at the substrate surface. Such a current density is desired, but rarely achieved, to provide for uniform metal layers at the surface of the substrate and in the through-holes. Circuit defects may occur when the current density at the surface of the substrate is different from that of the through-holes.

The method of depositing a metal on the substrate disclosed in the '924 patent involves applying a pulsed periodic reverse current across the electrodes of a plating cell utilizing a peak reverse current density and a peak forward current density, and varying the ratio of the peak reverse current density to the peak forward current density in periodic cycles to provide a metal deposit of uniform appearance, fine grain structure and uniform metal thickness onto the substrate. One way to vary this ratio is by holding the peak forward current constant while varying the peak reverse current density.

The metal which is deposited onto the substrate depends on the application. For example copper is generally used as an undercoat for protection and conductivity while gold may be used as a topcoat for decoration, protection and function such as for electrical contacts. Copper and gold alloys also may be plated with this method. Other metals which may be deposited by the method include tin, lead, palladium, nickel, silver, zinc, and their alloys. The method is typically used to deposit copper onto printed circuit boards with high aspect ratios, where aspect ratio is board thickness divided by through-hole diameter.

While the method disclosed in U.S. Pat. No. 6,402,924 addresses many of the problems discussed above in metal plating, the printed circuit board industry continuously seeks greater circuit densification, thus demanding further improvements in metal plating. To increase density, the industry has resorted to multi-layer circuits with through-holes or interconnections passing through multiple layers. Multi-layer circuit fabrication results in an overall increase in the thickness of the board and a concomitant increase in the length of an interconnection passing through the board. This means that increased circuit densification results in increased aspect ratios and through-hole length and an increase in the severity of, for example, the dog boning problem. For high density boards, aspect ratios may exceed ten to one.

Another problem encountered in metal plating is the formation of nodules, also called dendrites, on the metal deposit. Nodules are believed to be crystals of the metal being plated and grow out of the plated surface. Although the cause of nodules has been the subject of some debate, nodules typically appear when there are incomplete suppressor layers on the substrate. Suppressors generally provide a large change in the kinetic overpotential of the deposition reaction. This tends to give a more uniform current distribution over the surface of the substrate and allows the metal deposition to proceed with a global leveling. Suppressors adsorb onto many metals such as copper and are not typically consumed during the metal deposition reaction. Suppressors may be distinguished from levelers, which also increase surface overpotential but are consumed or altered during metal deposition. Generally, suppressors are high molecular weight oxygen containing polymers such as polyethylene oxide, polypropylene oxide, copolymers (random and block) of the monomers of the preceding polymers, and other surfactant molecules.

Nodules may range in diameter of from less than 1 micron to as large as several millimeters. Nodules are undesirable for a variety of electrical, mechanical, and cosmetic reasons. For example, nodules are readily detached and carried by cooling air flows into electronic assemblies, both within and external to electronic article housings, where they may cause short-circuit failure. Accordingly, the nodules have to be removed before the plated substrates are assembled into electronic articles. Conventional methods of removing the nodules involve laser inspection of each metal plated substrate followed by manual removal of the nodules by workers using microscopes. Such conventional methods leave room for worker error and are inefficient.

Accordingly, there is a need for an improved method of depositing metals and metal alloys on substrates which increase throwing power and reduce nodule formation.

SUMMARY OF THE INVENTION

A method including the steps of generating an electric current through an electrically conductive substrate, electrolyte and anode in electrical communication; and interrupting the current for one or more intervals to increase throwing power and to reduce nodules on a metal deposited on the electrically conductive substrate. An electromotive force (emf) or voltage is generated from a suitable source to provide an electrical current through the electrically conductive substrate, electrolyte and anode which are all in electrical communication with each other to provide a complete electrical circuit. The electrically conductive substrate functions as a cathode in the electrical circuit. A metal or metal alloy is deposited on the electrically conductive substrate during current flow. When current flow is interrupted for one or more intervals, metal deposition stops or is at least reduced. Current interruption for the one or more intervals throughout the plating cycle provides a substrate with metal or metal alloy deposits having increased throwing power and reduced nodules in contrast to many conventional metal depositions processes.

The electrolyte contains one or more type of metal ion to provide the source of the metal or metal alloy deposited onto the electrically conductive substrate. Generally the source of metal ions is a metal salt which is soluble or at least dispersible in the electrolyte diluent. Any metal which may be plated may be used to practice the method. In addition to one or more metal salt, the electrolyte also may include one or more additives such as brighteners, suppressors, levelers, antioxidants, chelating agents, complexing agents, surfactants, buffers, halogens, and electrically conductive salts. Other additives may be included in the electrolyte depending upon the type of metal or metal alloy to be deposited on the substrate.

Any suitable anode may be used to practice the method. Such anodes may be soluble or insoluble. The anodes may be metal or metal oxides and may include either noble or non-noble metals.

In another embodiment the method includes generating an electric current through an electrically conductive substrate, electrolyte and anode in electrical communication; and interrupting the current for an interval of from 0 minutes to 5 minutes within an initial 10 minutes of a metal plating cycle with additional current interruptions of intervals from 0 to 5 minutes for every 10 to 20 minutes of the metal plating cycle. The duration of the metal plating cycle may vary depending upon the metal or metal alloy thickness desired on the electrically conductive substrate. The method increases the throwing power and reduces nodules on the metal or metal alloy deposit in contrast to many conventional metal and metal alloy plating processes. Additionally, the plated product is resistant to Kirkendall void type defects.

In another embodiment articles made by the methods include one or more substrates with one or more metal or metal alloy layers which have throwing powers of at least 0.5:1. Such substrates have irregular geometries such as through-holes for the connection of circuit lines, thus the articles may be multi-layered. Accordingly, the methods provide for plating current densities at the center of the through-holes which are close to or the same as at the surface of the substrate. This provides for metal layers which have uniform thickness or near uniform thickness, thus preventing or reducing circuit defects in the articles. Additionally, the metal and metal alloy layers of the articles have reduced nodules in contrast to many conventional articles and are resistant to Kirkendall void type defects.

DETAILED DESCRIPTION OF THE INVENTION

Figure 1A:
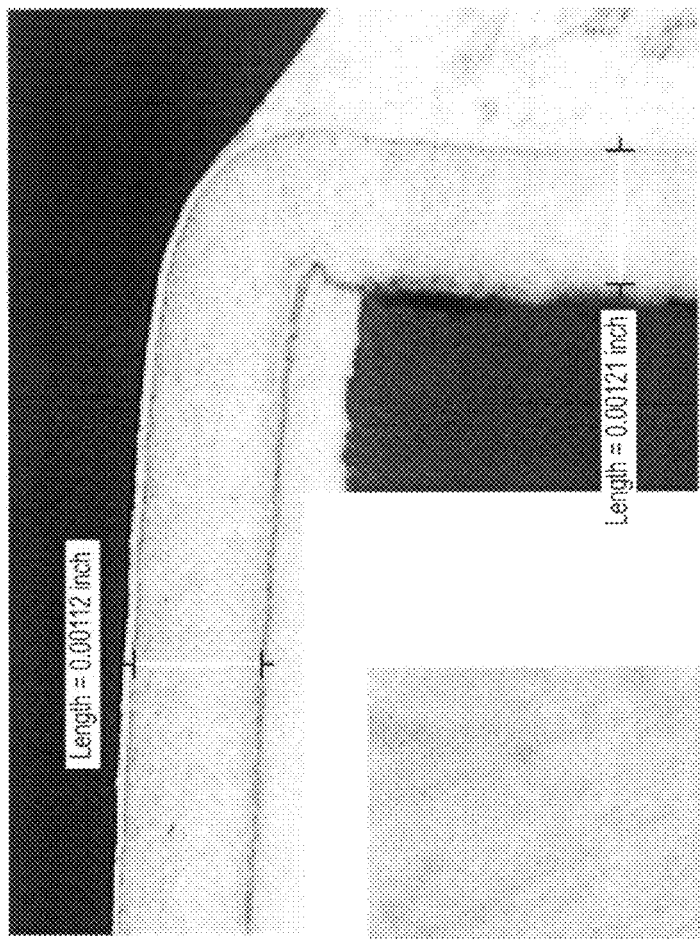
FIGS. 1A-B are photographs of a center section and upper section of a through-hole plated with copper having an average throwing power of greater than 0.9:1.

As used throughout the specification the following abbreviations have the following meanings, unless the context clearly indicates otherwise: ° C.=degrees Centigrade; mA=milliamps; cm=centimeter; V=volts; hr=hours; min.=minutes; wt %=percent by weight; mm=millimeters; g/L=grams/Liter; mils=0.001 mils/inch; inch=2.54 cm/inch; ms=milliseconds; and SEM=scanning electron micrograph.

The terms "printed wiring board" and "printed circuit board" are used interchangeably throughout the specification.

"Depositing" and "plating" are used interchangeably throughout the specification. "Multilayer" refers to two or more layers. "Throwing power" is defined as the ratio of the metal deposit thickness at the center of a hole to the metal deposit thickness at the surface of the hole. "Aspect ratio" means substrate thickness divided by aperture diameter. "Aperture" means hole such as a through-hole or a depression such as a via in the surface of a substrate.

All percentages are by weight, unless otherwise noted. All numerical ranges are inclusive and combinable in any order, except where it is logical that such numerical ranges are constrained up to 100%.

Methods include the steps of generating an electric current through an electrically conductive substrate, electrolyte and anode in electrical communication; and interrupting the current at one or more intervals in the plating cycle to increase throwing power and to reduce nodules on a metal deposited on the electrically conductive substrate. An electromotive force (emf) or voltage is generated from a suitable power source to provide an electrical current through the electrically conductive substrate, electrolyte and anode which are all in electrical communication with each other to provide a complete electrical circuit. When current flow is interrupted at the defined intervals, metal deposition stops or is at least reduced. Current interruption at the one or more intervals throughout the plating cycle provides a substrate with metal or metal alloy deposits having increased throwing power and reduced nodules in contrast to many conventional metal deposition processes. Additionally, articles plated by the present methods are resistant to Kirkendall void type defects.

Any suitable combination of time intervals may be used throughout the plating cycle to interrupt current as long as the combination of intervals provides a throwing power of the metal and metal alloys deposited on the substrate of at least 0.5:1, or such as from 0.5:1 to 1:1, or such as from 0.6:1 to 0.95:1, or such as from 0.7:1 to 0.9:1. Such throwing power ranges indicate that plating current densities at the surface of substrates with irregular geometries are the same or close to the same as in apertures in the substrates. This provides for global leveling of the metal layers which reduces the probability of circuit defects in the final articles.

In addition to providing a throwing power of at least 0.5:1, the combination of time intervals for interrupting the plating cycle reduces the number of nodules or dendrites formed on the metal and metal alloy deposits. While the cause of nodules has been the subject of some debate, nodules appear when there are incomplete suppressor layers on the substrates. The interruptions in the plating cycle appear to compensate for the incomplete suppressor layers.

In another embodiment the method includes generating an electric current through an electrically conductive substrate, electrolyte and anode in electrical communication with each other and a source of electromotive force or voltage to provide current; and interrupting the current for an interval of 0 minutes to 5 minutes within an initial 10 minutes of a metal plating cycle with additional current interruptions of 0 to 5 minutes for every 10 to 20 minutes of the metal plating cycle.

Intervals of current interruptions within the initial 10 minutes of the metal plating cycle also may range from 5 seconds to 3 minutes, or such as from 15 seconds to 2 minutes, or such as from 20 seconds to 60 seconds. Intervals of current interruption after the initial 10 minutes of the plating cycle also may range from 5 seconds to 3 minutes, or such as from 15 seconds to 2 minutes, or such as from 20 seconds to 60 seconds for every 10 minutes of the remainder of the metal plating cycle, or such as for every 20 minutes of the remainder of the metal plating cycle.

Duration of the metal plating cycle may vary depending upon the thickness of the metal or metal alloy deposit desired on the substrate. Typically, the plating cycles range from at least one minute, or such as from one minute to 5 hours, or such as from 30 minutes to 2 hours.

Any suitable plating cycle may be used to practice the methods. Pulse plating is an example of a suitable plating cycle such as periodic reverse pulse plating. DC (direct current) plating also may be used. Net current for the plating cycle is in the cathodic or plating direction such that a metal or metal alloy is deposited on the electrically conductive substrate. Accordingly, the electrically conductive substrate acts as the cathode. Current density is raised from 0 to a desired current density for depositing the metal or metal alloy on the electrically conductive substrate. Optimum plating current densities vary depending on the metal or metal alloy workers desire to deposit. Such current densities for a given metal or metal alloy are known in the art or may be determined with some experimentation. When a current interruption interval is desired during the metal plating cycle, the current is reduced to 0 and the metal plating ceases or is at least reduced. When the current interruption interval ends, the current is once again raised to the desired current density for continued metal deposition.

Any suitable current density may be used to practice the methods. Such current densities may range 1 $mA/cm^2$ and higher, or such from as from 5 $mA/cm^2$ to 200 $mA/cm^2$, or such as from 5 $mA/cm^2$ to 125 $mA/cm^2$, or such as from 5 $mA/cm^2$ to 50 $mA/cm^2$.

Any suitable anode may be used. The anodes may be soluble anodes such as a copper film or grid. Noble and non-noble insoluble anodes also may be employed. Examples of such insoluble anodes are iridium dioxide and lead dioxide.

Any suitable electrolyte may be employed to deposit a metal or metal alloy. The composition of the electrolyte may vary depending on the type of metal or metal alloy to be deposited. In addition to one or more sources of metal ions, the electrolytes also may include one or more diluents, and one or more optional additives such as brighteners, suppressors, levelers, accelerators, antioxidants, buffers, electrically conductive salts, halides, and surfactants as well as other additives to tailor the electrolyte for plating a particular metal or metal alloy.

Examples of metals which may be plated include copper, tin, nickel, cobalt, chromium, cadmium, lead, silver, gold, platinum, palladium, bismuth, indium, rhodium, ruthenium, iridium, zinc, or alloys thereof. Typically the methods are used to deposit copper and copper alloys. Metals are included in the compositions as soluble salts or are at least dispersible in the electrolyte diluent. Any suitable metal salt or compound may be employed. Examples of suitable copper compounds include copper halides, copper sulfates, copper alkane sulfonate, copper alkanol sulfonate, or mixtures thereof. Such copper compounds are water-soluble.

A sufficient amount of a metal salt is included in the electrolyte such that the concentration of the respective metal ion is from 0.010 g/L to 200 g/L, or such as from 0.5 g/L to 100 g/L. When copper is the metal, a sufficient amount of copper salt is employed such that the copper ion concentration ranges from 0.01 to 100 g/L, or such as from 0.10 g/L to 50 g/L.

Any suitable diluents may be used in the electrolyte. Such diluents include water or organic solvents such as alcohol or other suitable organic solvents. Mixtures of solvents also may be employed.

Sources of halide ions include any suitable chloride salt or other source of chloride that is soluble in the electrolyte. Examples of such chloride ion sources are sodium chloride, potassium chloride, hydrogen chloride, or mixtures thereof. Typically, the chloride ion source is included in electrolyte such that the chloride ion concentration ranges from 0.02 ppm to 125 ppm, or such as from 0.25 ppm to 60 ppm, or such as from 5 ppm to 35 ppm.

Brighteners that may be employed in the electrolyte include any brightener that is suitable for the metal which is to be plated. Brighteners may be specific for the metal or metal alloy. Brighteners may be included in the electrolyte in amounts of 0.001 ppm to 1.0 ppm.

Examples of suitable brighteners include sulfur containing compounds that have a general formula S—R—SO$_3$, where R is substituted or unsubstituted alkyl or substituted or unsubstituted aryl group. More specifically, examples of suitable brighteners include compounds having structural formulas HS—R—SO$_3$X, XO$_3$—S—R—S—S—R—SO$_3$X or XO$_3$—S—Ar—S—S—Ar—SO$_3$X where R is a substituted or unsubstituted alkyl group, and preferably is an alkyl group having from 1 to 6 carbon atoms, more preferably is an alkyl group having from 1 to 4 carbon atoms; Ar is an aryl group such as phenyl or naphthyl; and X is a suitable counter ion such as sodium or potassium. Specific examples of such compounds include n,n-dimethyl-dithiocarbamic acid-(3-sulfopropyl)ester, carbonic acid-dithio-o-ethylester-sester with 3-mercapto-1-propane sulfonic acid (potassium salt), bissulfopropyl disulfide (BSDS), 3-(benzthiazolyl-s-thio)propyl sulfonic acid (sodium salt), pyridinium propyl sulfonic sulfobetaine, or mixtures thereof.

Examples of other suitable brighteners include 3-(benzthiazoyl-2-thio)-propylsulfonic acid sodium salt, 3-mercaptopropane-1-sulfonic acid sodium salt, ethylenedithiodipropylsulfonic acid sodium salt, bis-(p-sulfophenyl)-disulfide disodium salt, bis(ω-sulfobutyl)-disulfide disodium salt, bis-(ω-sulfohydroxypropyl)-disulfide disodium salt, bis-(ω-sulfopropyl)-disulfide disodium salt, bis-(ω-sulfopropyl)-sulfide disodium salt, methyl-(ω-sulfopropyl)-disulfide sodium salt, methyl-(ω-sulfopropyl)-trisulfide disodium salt, o-ethyl-dithiocarbonic acid-S-(ω-sulfopropyl)-ester potassium salt, thioglycolic acid, thiophosphoric acid-o-ethyl-bis-(ω-sulfopropyl)-ester disodium salt, thiophosphoric acid-tris(ω-sulfopropyl)-ester trisodium salt, N,N-dimethyldithiocarbamic acid (3-sulfopropyl) ester sodium salt (DPS), (o-ethyldithiocarbonato)-S-(3-sulfopropyl)-ester potassium salt (OPX), 3-[(amino-iminomethyl)-thio]-1-propanesulfonic acid (UPS), 3-(2-benthiazolylthio)-1-propanesulfonic acid sodium salt (ZPS), thiol of bissulfopropyl disulfide (MPS), or mixtures thereof.

Examples of suitable levelers include lactam alkoxylates. Examples of such compounds include β-propiolactam ethoxylate, γ-butyrolactam-hexa-ethoxylate, α-valerolactam-octa-ethoxylate, δ-valerolactam-penta-propoxylate, ∈-caprolactam-hexa-ethoxylate, or ∈-caprolactam-dodeca-ethoxylate. Such leveling agents are included in the electrolyte in amounts of from 0.002 to 3 g/L.

Another example of suitable levelers includes polyalkylene glycol ethers. Amounts of polyalkylene glycol ether that may be included in the electrolyte range from 0.005 to 30 g/L. Relative molecular mass may be from 500 to 3500 g/mole, preferably from 800 to 4000 g/mole.

Examples of such polyalkylene glycol ethers include dimethyl polyethylene glycol ether, dimethyl polypropylene glycol ether, di-tertiary butyl polyethylene glycol ether, stearyl monomethyl polyethylene glycol ether, nonylphenol monomethyl polyethylene glycol ether, polyethylene polypropylene dimethyl ether (mixed or block polymer), octyl monomethyl polyalkylene ether (mixed or block polymer), dimethyl-bis(polyalkylene glycol)octylene ether (mixed or block polymer), and β-naphthol monomethyl polyethylene glycol.

Any suppressor (carrier) that is employed in metal plating may be employed in the electrolyte. While the concentrations of suppressors may vary from one electroplating bath to another, suppressors typically range from 100 ppm or greater. Examples of such suppressors are polyhydroxy compounds such as polyglycols, e.g., poly(ethylene glycol), poly(propylene glycol) and copolymers thereof. The poly(ethylene glycol) may range in molecular weight from 1000 to 12000. Other suitable compounds include, but are not limited to, polyethylene oxide, polypropylene oxide, and co-polymers (random and block) of the monomers of the polyethylene oxide and polypropylene oxide.

Any suitable buffer or pH adjuster may be employed. Such pH adjusters may include, for example, inorganic acids such as sulfuric acid, hydrochloric acid, nitric acid, phosphoric acid, or mixtures thereof. Sufficient acid is added to the compositions such that the pH ranges from 0 to 14, or such as from 0 to 8, or such as from 0 to 6, or such as from 0 to 3. The pH range may vary depending on the metal or metal alloy being plated.

During plating the electrolyte may range in temperature from 18° C. to 110° C., or such as from 25° C. to 60° C. Temperature ranges may vary depending on the metal or metal alloy to be deposited. Copper electrolytes may be maintained at a temperature range of from 20° C. to 80° C. with acid copper baths (pH from 0 to 4) at temperatures of from 20° C. to 50° C.

The methods may be used to metal plate any suitable electrically conductive substrate. When a substrate is made of a dielectric material, the substrate may be treated or activated such that the entire substrate may be made electrically conductive, or it may be selectively activated such that only sections of the substrate are metal plated. Various methods are known in the art by which to activate a substrate for metal plating. One such method is to conversion coat the non-conductive substrate with metal sulfides such as iron, cobalt, nickel and copper sulfides as disclosed in U.S. Pat. No. 4,810,333. An example of another method of conversion coating is to treat the surface of a non-conductive substrate with an acid colloidal solution of a tin-noble metal electroless metal plating catalyst and then treating the surface with a solution containing dissolved sulfides capable of reacting with the metal plating catalyst to form a sulfide of the catalytic noble metal as disclosed in U.S. Pat. No. 4,895,739.

Substrates plated with the current interruption methods may be used in any industry where metal plated substrates are used such as in the manufacture of electrical articles. Examples of such electrical articles include printed wiring boards, integrated circuits, electrical contact surfaces and connectors, electrolytic foil, silicon wafers for microchip applications, semi-conductors and semi-conductor packaging, lead frames, optoelectronics, and optoelectronic packaging.

For example, in the manufacture of printed wiring boards, metal and metal alloy deposits with throwing powers of 0.5:1 and greater are desired. Also metal and metal alloy deposits with reduced nodules are desired as well to provide an electrical article having reliable performance. There are various processes for making printed wiring boards, including multilayer printed wiring boards, known in the art.

In printed circuit board manufacture the substrate typically is an epoxy substrate filled with glass fibers and is copper clad on at least one of its surfaces. Through-holes are formed by drilling or punching or any other suitable method known in the art. The through-holes are then desmeared to remove any accretions on the walls of the through-holes. Desmearing may be done using sulfuric acid, chromic acid or plasma etching or etchback of the holes with chromic acid followed by glass etching, or any other suitable method. Following desmearing or etchback of the through-holes, the board base material is conventionally treated with a glass etch that removes glass fibers extending into the through-holes from the through-hole walls. This is followed by a solution that cleans the copper surface and conditions the through-hole wall to promote catalyst adsorption. Such solutions may be aqueous alkaline surfactants.

The boards may then be immersed in a catalyst pre-dip solution. Such solutions include the same medium as the catalyst solution but without the colloid. Proprietary catalyst pre-ip compositions are commercially available and an example of a suitable material is available from Rohm and Haas Electronic Materials identified as Cataprep™ 404.

The boards are then immersed into an aqueous catalyst composition. Such catalyst compositions contain reduction products formed by the reduction of a noble catalytic metal by, for example, tin in an acidic medium. The reduction product of palladium by tin in the acidic medium is typical. An example of such a catalyst is Cataposit™ R-44 and is available from Rohm and Haas electronic Materials. Conventional non-noble metal catalysts also may be used. Catalysis may take from 1 minute to 10 minutes at a temperature of 20° C. to 70° C.

Optionally, the boards may be treated with an accelerator. A suitable accelerator removes part of the metal oxide formed by the catalyst such as tin oxide. Examples of suitable accelerators are hydrochloric acid and perchloric acid. Acceleration is accomplished by immersion of the boards in an aqueous solution of the accelerator for a period of from 1 minute to 5 minutes at a temperature of from 20° C. to 70° C.

After application of the catalyst, or accelerator, the boards are conversion coated to make them electrically conductive for metal or metal alloy deposition. Any suitable method known in the art may be used to conversion coat the boards. Chalcogenide formation is one process which may be used. Chalocogenide formation occurs by contact of the catalytic layer with a solution of a chalcogen. The chalcogenide treatment solution may be an aqueous solution of a water soluble chalcogen salt. Sulfide is a typical chalcogen. Examples of suitable sulfide salts are alkaline earth metal sulfide salts such as sodium, potassium and lithium sulfides. Chalcogenide treatment solutions have salt concentrations of 0.1 g/L to 15 g/L.

After conversion coating the boards are immersed into a metal or metal alloy electrolyte (plating bath) for deposition of the metal or metal alloy. Any suitable metal or metal alloy electrolyte may be used to deposit one or more metal layers on the boards. Typically copper or a copper alloy electrolyte is used for plating printed circuit boards. Suitable copper alloys which may be deposited on printed circuit boards include, but are not limited to, copper/tin, copper/bismuth, copper/gold, copper/silver, and copper/nickel. Additional metals which may be plated include, but are not limited to, nickel, tin and their alloys.

A suitable aqueous copper electrolyte includes one or more water soluble copper salts such as copper sulfate pentahydrate in amounts to provide copper ions of 0.1 g/L to 50 g/L, one or more sources of chloride ion such as sodium chloride in amounts to provide chloride ions of 5 ppm to 35 ppm, one or more brighteners such as BSDS in amounts of 0.1 ppm to 0.5 ppm, one or more levelers such as a lactam alkoxylate in amounts of 0.005 g/L to 0.2 g/L, one or more suppressors such as poly(ethylene glycol) with molecular weights of 2500 to 5000 in amounts of 500 ppm to 1000 ppm, and one or more inorganic acids such as sulfuric acid in sufficient amounts to maintain an electrolyte pH of 0 to 1.

The boards (cathodes) are immersed into the aqueous copper electrolyte along with a counter electrodes (anodes) such as insoluble lead dioxide electrodes and are connected to a source of an electromotive force such that the boards, anodes, electrolyte and emf source are in electrical communication with each other to provide a complete electrical circuit. Current density ranges from 10 mA/cm$^2$ to 40 mA/cm$^2$.

The plating cycle begins by initially raising the current from 0 to a level suitable for plating and is maintained at that range for 1 minute to 5 minutes and then is dropped to 0 for 1 minute to 5 minutes to interrupt the flow of current within the first 10 minutes of the plating cycle. After the first 10 minutes of the plating cycle, the current is raised from 0 back to a plating range followed by additional current interruptions of from 1 minute to 5 minutes every 10 minutes to 20 minutes of the plating cycle until a desired copper layer thickness is achieved on the surface and through-holes of the printed wiring boards.

The copper plating method provides copper metal deposits with a throwing power of at least 0.5:1, or such as 0.7:1, or such as 0.8:1, or such as 0.9:1. Accordingly, the problem of dog-boning found in many conventionally plated printed wiring boards is reduced. In addition the boards show reduced numbers of nodules in contrast to copper metal deposits plated with many conventional processes which do not use the current interruption methods.

Plating time for printed wiring boards may range from 45 minutes to 5 hours. For circuit board manufacture, a desired metal or metal alloy thickness may range from 60 mils to 400 mils, or such as from 80 mils to 200 mils, or such as form 90 mils to 150 mils.

The current interruption methods are suitable for metal plating through-holes of multi-layer circuit boards with aspect ratios of at least 5:1, or such as from 7:1 to 10:1. Typically, plated through-holes have average diameters ranging from 0.02 cm to 0.1 cm, or such as from 0.3 cm to 0.7 cm, however, the average diameters of plated though-holes made by the current interruption methods may vary from the foregoing ranges.

Both vertical and horizontal plating processes may be employed. In vertical processes the substrate, such as a printed wiring board, is sunk in a vertical position into a container containing an electrolyte. The substrate, which functions as a cathode, is situated in the vertical position opposite to at least one soluble or insoluble anode. The substrate and the anode are connected to a current source and an electrical current. Various apparatus for generating an emf are well known in the art. The electrolyte is directed continuously through a container with the cathode and anode by means of transporting equipment such as a pump. Any suitable pump employed in electroplating processes may be employed. Such pumps are well known in the electroplating industry and are readily available.

In the horizontal plating process, the substrate or cathode is transported through a conveyorized unit in a horizontal position with a horizontal direction of movement. Electrolyte is injected continuously from below and/or above and onto the substrate by means of splash nozzles or flood pipes. Anodes are arranged at spacings relative to the substrate and are brought into contact with the electrolyte by means of a suitable device. The substrate is transported by means of rollers or plates. Such horizontal apparatus are well known in the art.

After the printed wiring boards are plated they may undergo further processing by one or more conventional processes known in the art to form multi-layer circuit boards and then assembled with other components to form various electrical articles and devices.

The following examples are provided to better describe the invention, and are not intended to limit the scope of the invention.

Example 1

Throwing Power

A multi-layer copper clad printed circuit board with an array of 0.03 cm, 0.07 cm and 0.09 cm through-holes was pre-cleaned by immersing the board in an aqueous alkaline solution of an organic epoxy solvent of Circuposit™ Conditioner 3302 (obtainable from Rohm and Haas electronic Materials, Marlboro, Mass.) at 70° C. mean temperature for 10 minutes and then rinsed with water.

The through-hole walls were then desmeared with a permanganate solution of MLB Promoter™ 3308 at a mean temperature of 70° C. for 10 minutes and then rinsed with water. The residues were then neutralized and charge modification was done using a single treatment solution composed of hydroxylammonium acetate (50 g/L), methane sulfonic acid (140 g/L), surfactants (5 g/L), polyelectrolyte (10 g/L) and one liter of water for 5 minutes at 50° C. The board was then rinsed with water.

A conductive particle coating was then applied to the board. The conductive particle coating was a basic carbonaceous dispersion of graphite. The board was submerged in the dispersion for 5 minutes at room temperature. The board with the conductive particle coating was then placed in an air circulating oven maintained at 80° C. until the coating was dry.

The copper cladding on the board was microetched to remove the dispersion coating from the copper cladding. The board was then sprayed with water. The non-conductive portions of the board were then ready for metallizing.

The board was then placed into a plating tank with an aqueous electrolyte including 10 g/L of copper sulfate pentahydrate, 150 g/L of sulfuric acid, 50 ppm of chloride ions, 200 ppm of poly(ethylene glycol), and 0.5 ppm of BSDS. The pH of the electrolyte was maintained from 0 to 1 throughout the plating cycle.

The board was joined to an emf source along with a copper anode to provide a complete circuit. During plating the current was maintained at 50 mA/cm$^2$. The plating cycle began by raising the current from 0 to 50 mA/cm$^2$ and maintaining the current at 50 mA/cm$^2$ for 5 minutes to plate copper on the board followed by decreasing the current down to 0 for a 1 minute current interruption interval and then increasing the current back to 50 mA/cm$^2$ for the remaining initial 10 minutes of the plating cycle. After the initial 10 minutes of the plating cycle was completed, the current was decreased to 0 for 1 minute current interruption intervals every 20 minutes until the plating cycle was completed.

Figure 1B:
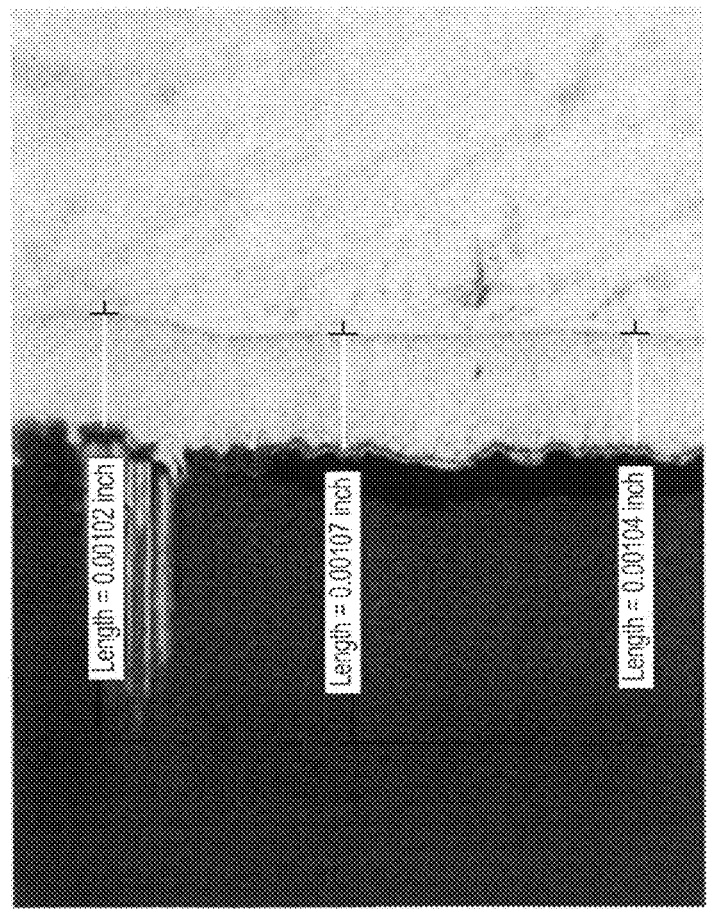

FIGS. 1A and 1B show a SEM of a cross-section of one of the copper plated through-holes. FIG. 1A shows the center section of the through-hole and 1B shows the upper or surface portion of the through-hole. The throwing power of the copper metal layer of this through-hole was determined to be greater than 0.9 (diameter of the thickness of the copper layer at the center of the through-hole/the thickness of the copper layer at the surface of the through-hole). Optimum throwing power is 1. Accordingly, the current interruption method provided a copper metal layer having good throwing power.

Example 2

Comparative

Dendrite Reduction

Two multi-layer copper clad printed circuit boards with an array of 0.03 cm, 0.07 cm, and 0.09 cm through-holes were pre-cleaned and condition coated by the same method as described in Example 1. After the pre-treatment process was completed each board was placed into an copper electrolyte for copper metal deposition.

The copper electrolyte included 20 g/L of copper sulfate pentahydrate, 250 g/L of sulfuric acid, 100 ppm of chloride ions, 100 ppm of poly(ethylene glycol), and 0.5 ppm of BSDS. The pH of the electrolyte was maintained from 0 to 1 throughout the plating cycle.

Each board was placed in a separate plating tank. One board acted as a control where it was plated using a conventional plating process while the other was plated using a current interruption method. The current density for each was maintained at 50 mA/cm$^2$ during copper plating. Each multi-layer board was connected to an emf source along with a copper anode as the counter electrode. The plating cycle lasted for 2 hours.

Figure 2A:
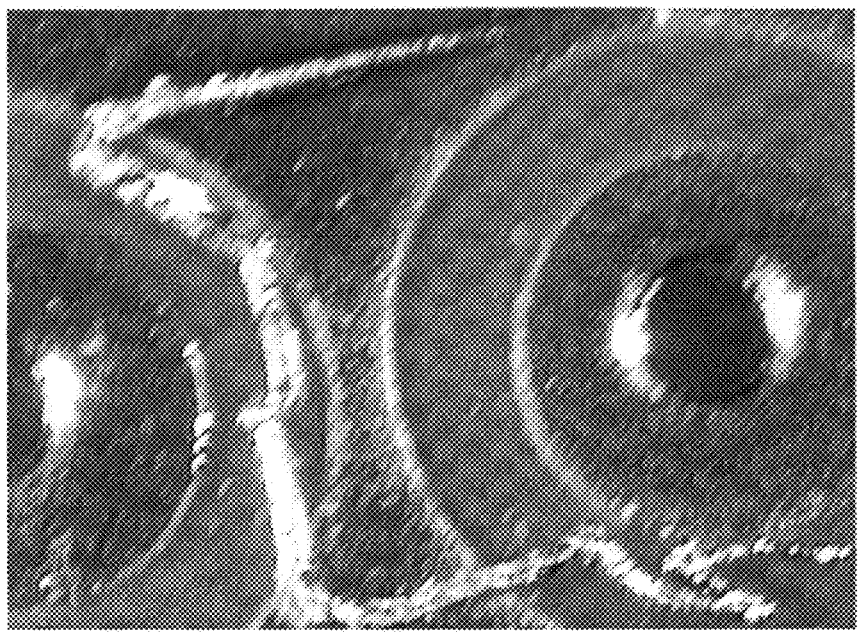
FIGS. 2A-D are photographs of four sections of a surface of a copper plated circuit board showing nodules.
Figure 2B:
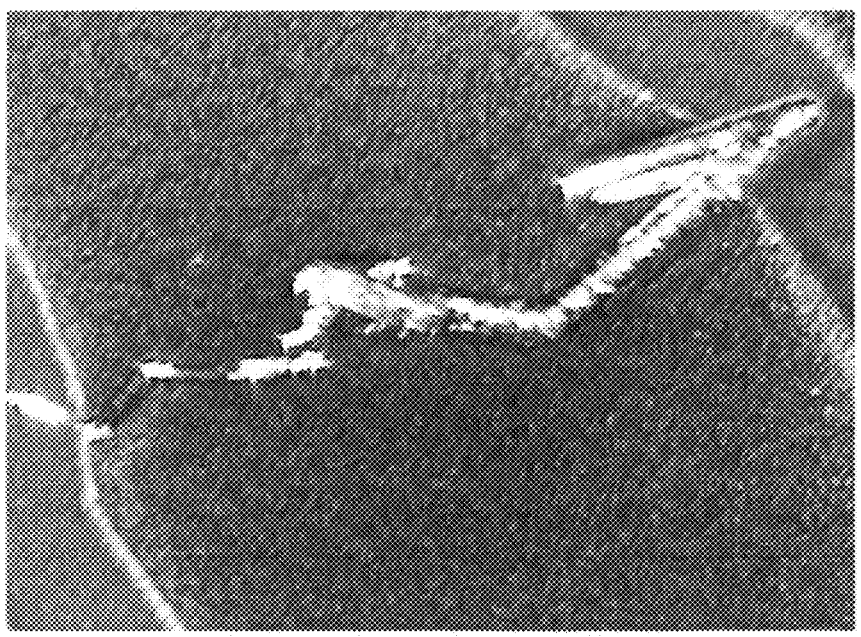

After the plating cycle was over the control board was analyzed for stringy nodules or dendrites using a conventional laser inspection technique. Dendrites were detected on the surface of the copper plated board. FIGS. 2A and 2B are SEMs of the board showing large dendrites on the surface of the board across the copper plated portion of the surface.

The second board was copper plated with a current interruption method. The electrical potential was initially raised from 0 to 50 mA/cm$^2$ and maintained at 50 mA/cm$^2$ for 2 minutes then the current was interrupted for 5 minutes by reducing the current to 0. The current was then resumed by raising it back to 50 mA/cm$^2$ for the remainder of the first 10 minutes of the plating cycle. After the initial 10 minutes of the plating cycle was completed, the current was interrupted for 2 minutes for every 10 minutes of the plating cycle until the plating cycle was completed. The cycle was completed after 2 hours.

Figure 2C:
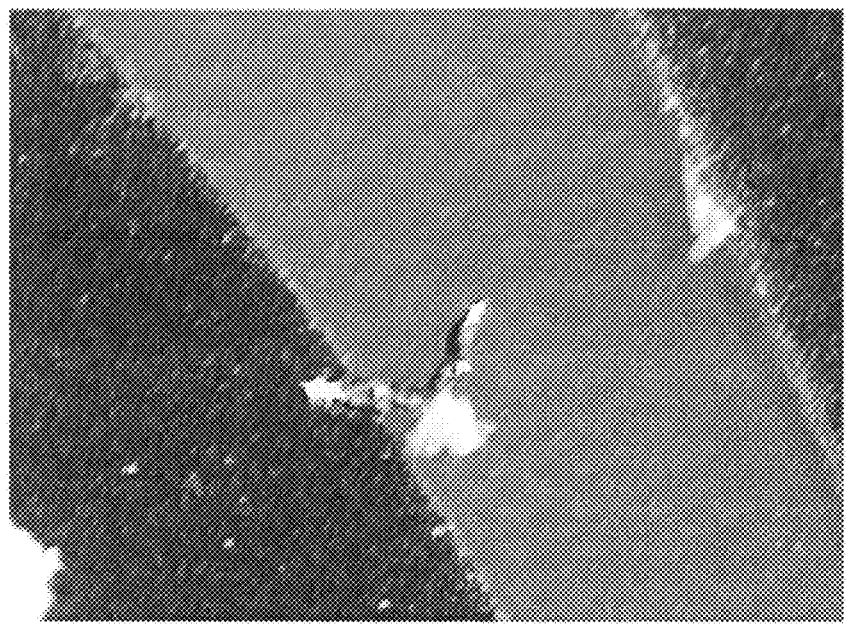
Figure 2D:
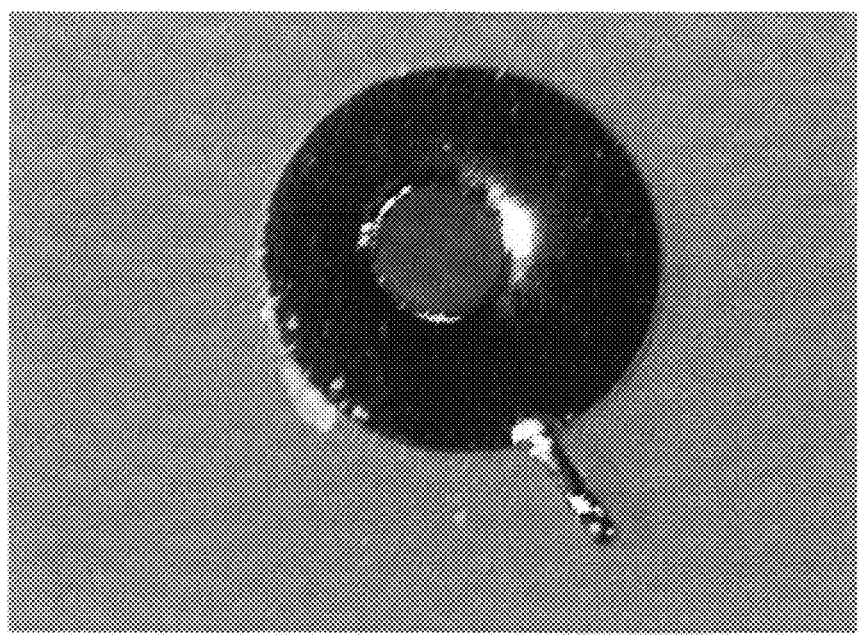

After the plating cycle was completed the board was analyzed for dendrites. Analyses were performed using the conventional laser inspection method as for the control board. Some dendrites were detected but fewer were detected than in the control board. FIGS. 2C and 2D show SEMs of a portion of the copper plated board. A single small stringy dendrite is shown at the plated copper at the edge of a through-hole in both FIGS. 2C and 2D. The current interruption method reduced the number of dendrites in contrast to the control board which was plated by a conventional process. Accordingly the current interruption method was an improvement in plating copper metal.

Example 3

Comparative

Dendrite Reduction on Double Sided Panels and Throwing Power

48 FR-4/epoxy copper clad panels were provided. Holes were drilled in each panel to provide an array of through-holes having diameters of 0.03 cm, 0.07 cm, and 0.09 cm. Each panel was pre-treated to remove accretions from the though-holes using conventional permanganate solutions. Selective portions of the non-conductive parts of each board were conversion coated using a conventional chalcogen solution and conventional processes to make the portions electrically conductive for copper metal deposition.

Each panel was plated in an aqueous copper electrolyte composed of 50 g/L of copper sulfate pentahydrate, 250 g/L of sulfuric acid, 100 ppm of chloride ions, 300 ppm of poly (ethylene glycol) and 1 ppm of BSDS. The pH of the electrolyte was maintained from 0 to 1 during the plating cycle.

All of the panels were joined to an emf source along with a copper anode to provide a complete electrical circuit. The current during copper plating was maintained at 50 mA/cm$^2$. 12 panels (controls) were copper plated using a conventional plating process, while the remaining 36 panels were copper plated with a current interruption method.

The conventional plating cycle continued for 1 hour. Each panel was then analyzed for dendrite formation using the conventional laser inspection method. All of the panels showed dendrite formation. The number of dendrites was counted by workers using microscopes. The results are shown in the table below.

24 panels were plated by initially raising the current from 0 to 50 mA/cm$^2$ with a current interruption for 5 minutes followed by raising the current from 0 to 50 mA/cm$^2$ for the remainder of the initial 10 minutes of the plating cycle. Current interruptions of 1 minute intervals were then done for every 10 minutes of the plating cycle until the plating cycle was completed after 1 hour. Each board was then analyzed using the conventional laser inspection method. Workers used microscopes to manually count the number of dendrites on each board. The results are shown in the table below.

12 panels were plated by initially raising the current from 0 to 50 mA/cm$^2$ with a current interruption for 5 minutes followed by raising the current from 0 back to 50 mA/cm$^2$ for the remainder of the initial 10 minutes of the plating cycle. Current interruptions of 1 minute intervals were then done every 20 minutes for the remainder of the plating cycle. The plating cycle lasted 1 hour. Each panel was then analyzed using the conventional laser inspection method. Workers used microscopes to manually count the number of dendrites on each board. The results are shown in the table below.

TABLE

| | PANELS USED | TOATL NUMBER OF DENDRITES | AVERAGE NUMBER/PANEL |
|---|---|---|---|
| CONTROL | 12 | 14 | 1.2 |
| 10 MINUTE INTERRRUPTION | 24 | 6 | 0.25 |
| 20 MINUTE INTERRUPTION | 12 | 2 | 0.17 |

The results showed that the current interruption methods reduced the number of dendrites formed during copper plating in contrast to the conventional process of copper plating. The control panels had an average number of dendrites of 1.2 per panel, while the panels plated with the current interruption methods had averages of 0.25 and 0.17 per panel.

In addition to having reduced dendrite formation, the current interruption methods also had an average throwing power increase of greater than 90% over the throwing power of the panels plated using the conventional process. Accordingly, the current interruption methods provide for an improved copper plating method.

What is claimed is:

1. A method comprising generating an electric current through an electrically conductive substrate, electrolyte and anode in electrical communication; and interrupting the current by bringing current density to 0 for an interval of 1 minute within the initial 10 minutes of the copper metal plating cycle with additional interruptions of intervals of 1 minute for every 20 minutes of the copper metal plating cycle, wherein the electric current is direct current.

2. A method comprising generating an electric current through an electrically conductive substrate, electrolyte and anode in electrical communication; and interrupting the current by bringing current density to 0 for an interval of 5 minutes within the initial 10 minutes of the copper metal plating cycle with additional interruptions of intervals of 2 minutes for every 10 minutes of the copper metal plating cycle, wherein the electric current is direct current.

3. The method of claim 2, wherein the substrate is a printed wiring board, integrated circuits, electrical contact surfaces, connectors, electrolytic foil, silicon wafers, semi-conductors, lead frames or optoelectronics.

* * * * *